(12) United States Patent
Sekiguchi

(10) Patent No.: US 7,957,443 B2
(45) Date of Patent: Jun. 7, 2011

(54) LASER DEVICE

(75) Inventor: Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/974,134

(22) Filed: Dec. 21, 2010

(65) Prior Publication Data

US 2011/0090926 A1   Apr. 21, 2011

Related U.S. Application Data

(62) Division of application No. 12/302,524, filed as application No. PCT/JP2008/065788 on Aug. 27, 2008, now Pat. No. 7,881,352.

(30) Foreign Application Priority Data

Aug. 31, 2007  (JP) ................. 2007-226341

(51) Int. Cl.
*H01S 5/00* (2006.01)
(52) U.S. Cl. .................. 372/45.01; 372/46.01
(58) Field of Classification Search ............ 372/50.1, 372/46.01, 45.01; 257/680
See application file for complete search history.

(56) References Cited

U.S. PATENT DOCUMENTS

| | | | |
|---|---|---|---|
| 6,301,282 B1 * | 10/2001 | Capasso et al. | 372/46.01 |
| 6,359,520 B1 * | 3/2002 | Frazier et al. | 331/66 |
| 6,501,783 B1 | 12/2002 | Capasso et al. | 372/96 |
| 7,693,198 B2 * | 4/2010 | Sekiguchi et al. | 372/45.01 |
| 7,839,910 B2 | 11/2010 | Asada et al. | 372/45.01 |
| 2007/0280319 A1 | 12/2007 | Sekiguchi et al. | 372/45.01 |

FOREIGN PATENT DOCUMENTS

| | | |
|---|---|---|
| EP | 0 977 392 A2 | 2/2000 |
| EP | 1 863 140 A1 | 12/2007 |
| JP | 2000-138420 A | 5/2000 |
| JP | 2001-291929 A | 10/2001 |
| WO | WO 2008/075795 A1 | 6/2008 |

OTHER PUBLICATIONS

B.S. Williams et al., "Terahertz quantum-cascade laser at λ ≈ 100 μm using metal waveguide for mode confinement," Applied Physics Letters, vol. 83, No. 11, pp. 2124-2126 (Sep. 15, 2003).
M. Asada, "Density-Matrix Modeling of Terahertz Photon-Assisted Tunneling and Optical Gain in Resonant Tunneling Structures," Japanese Journal of Applied Physics, vol. 40, part 1, No. 9A, pp. 5251-5256 (Sep. 2001).
N. Orihashi et al., "Experimental and Theoretical Characteristics of Sub-Terahertz and Terahertz Oscillations of Resonant Tunneling Diodes Integrated with Slot Antennas," Japanese Journal of Applied Physics, vol. 44, No. 11, pp. 7809-7815 (2005).
"Transparent Conductive Film Technology," Chapter 5, Published by Ohmsha, Ltd., Japanese Society for the Promotion of Science (1999).

* cited by examiner

*Primary Examiner* — Minsun Harvey
*Assistant Examiner* — Tuan N. Nguyen
(74) *Attorney, Agent, or Firm* — Fitzpatrick, Cella, Harper & Scinto

(57) ABSTRACT

Provided is a long wavelength laser of which the operating point is stabilized and the laser oscillation is stabilized. The long wavelength laser comprises a resistor element provided to a portion where the surface current is maximum in a surface plasmon waveguide to stabilize a potential difference between a first cladding and a second cladding in the surface plasmon waveguide.

4 Claims, 8 Drawing Sheets

LASER DEVICE

CROSS REFERENCE TO RELATED APPLICATIONS

This application is a division of U.S. application Ser. No. 12/302,524, filed on Nov. 26, 2008, which is a U.S. national-stage entry of International Application PCT/JP2008/065788, filed on Aug. 27, 2008. The entire disclosures of the above-mentioned earlier applications are hereby incorporated by reference herein.

TECHNICAL FIELD

The present invention relates to an oscillation device in which a gain medium is sandwiched by negative dielectric constant media whose real part of the dielectric constant with respect to an electromagnetic wave is negative. More particularly, the present invention relates to a laser device which outputs an electromagnetic wave having a frequency in the range of from 30 GHz to 30 THz.

In the following description, the electromagnetic wave within the frequency range of from 30 GHz to 30 THz is referred to as millimeter wave or terahertz wave. Note that a range approximate to 30 GHz may be referred to as millimeter wave band, and that a range approximate to 30 THz may be referred to as terahertz wave band.

BACKGROUND ART

Examples of a new type semiconductor laser include a semiconductor laser called quantum cascade laser, which is based on a transition between energy levels (intersubband transition) of carriers within a common energy band of a conduction band or a valence band.

An oscillation wavelength of the quantum cascade laser depends on an energy gap between two energy levels with respect to optical transition. Therefore, the oscillation wavelength can be selected from over a wide spectral range (from a mid-infrared region to a terahertz wave band), and it has been first substantiated that such a laser can be achieved with a structure for which an oscillation wavelength of 4.2 μm in the mid-infrared region is selected.

In recent years, along with demands for an electromagnetic wave resource of a terahertz wave band which is considered to be useful for bio-sensing or the like, there has been conducted a development of a long wavelength laser for which the oscillation wavelength is selected from a region having longer wavelength than the mid-infrared region.

The long wavelength laser has such a structure of a gain medium as to produce a gain in a frequency range thereof and has a structure called surface plasmon waveguide, in which optical confinement to the gain medium can be strictly performed. This is different from a conventional semiconductor laser in which an optical confinement by a dielectric cladding is performed.

Japanese Patent Application Laid-Open No. 2000-138420 discloses a method of using as a cladding a negative dielectric constant medium whose real part of the dielectric constant is negative. In this case, a waveguide mode guided by the cladding is an electromagnetic wave to which polarization oscillation of charge carriers called surface plasmon within the negative dielectric constant medium has contributed. There is no diffraction limit in the surface plasmon, and thus the majority of mode intensities can be confined to the gain medium.

The use of such a technique achieves a laser oscillation whose oscillation wavelength is 11.4 μm, which is shifted toward longer wavelengths.

Further, Appl. Phys. Lett., Vol. 83, 2124 (2003) discloses a method of arranging, as a cladding, negative dielectric constant media whose real part of the dielectric constant is negative on a top and a bottom of a gain medium. In this case, the waveguide mode guided by the cladding is also the surface plasmon. A gain medium having two negative dielectric constant media as a cladding enables confinement of much more mode intensities to the gain medium, compared with the case in Japanese Patent Application Laid-Open No. 2000-138420. With the use of such a technique, a laser oscillation whose oscillation wavelength is about 100 μm (3 THz), which is more shifted toward longer wavelengths, is achieved.

In the long wavelength laser with the structure called surface plasmon waveguide as described above, stabilization for obtaining a desired laser oscillation is examined. Japanese Patent Application Laid-Open No. 2001-291929 discloses a technique of stabilizing the oscillation wavelength as a distributed feed-back (DFB) structure in which different negative dielectric constant media are repeated in a propagation direction of the waveguide mode. On the other hand, in the terahertz wave band where the oscillation wavelength is more shifted toward longer wavelengths, a stabilization technology in electronic devices can be utilized. Jpn. J. Appl. Phys., Vol. 44, 7809 (2005) discloses a technique of stabilizing oscillation of 0.59 THz (511 μm) by inserting a resistor element into an outside portion of an antenna resonator which is an electronic device.

However, in a conventional long wavelength laser, a tunnel injection is used as a method for current injection into a gain medium. Therefore, there has been a problem that an operating point is not stabilized and therefore a laser oscillation is made unstable.

The operating point is not stabilized, because a negative differential resistance region appears in current-voltage characteristics (I-V characteristics) along with the tunnel injection. This is a phenomenon which is not found in a typified optical semiconductor laser. Accordingly, the technique disclosed in Japanese Patent Application Laid-Open No. 2001-291929 is not assumed to be a sufficient stabilization structure for the conventional long wavelength laser, and hence a stabilization structure in which the operating point can also be stabilized has been required. Further, the technique disclosed in Jpn. J. Appl. Phys., Vol. 44, 7809 (2005) is a stabilization technique in electronic devices, which causes a problem that a laser oscillation cannot be attained when the stabilization technique is used for laser as it is.

DISCLOSURE OF THE INVENTION

According to one aspect of the present invention, there is provided a laser device including: a gain medium having a gain with respect to a specific electromagnetic wave; and a resonator structure for resonating the electromagnetic wave, in which a waveguide is formed by interposing the gain medium between a first cladding and a second cladding each comprised of a negative dielectric constant medium whose real part of the dielectric constant is negative with respect to the electromagnetic wave, and a resistor element for stabilizing a potential difference between the first cladding and the second cladding is provided to a portion where the surface current in the first cladding is maximum with the second cladding being set as a reference when the electromagnetic wave propagates in the waveguide.

Further, the laser device according to the present invention includes: a gain medium having a gain with respect to a specific electromagnetic wave; and a resonator structure for resonating the electromagnetic wave, in which a waveguide is formed by interposing the gain medium between a first cladding and a second cladding each comprised of a negative dielectric constant medium whose real part of the dielectric constant is negative with respect to the electromagnetic wave, and a resistor element for stabilizing a potential difference between the first cladding and the second cladding is provided to a portion where the surface current of the electromagnetic wave is maximum in the first cladding of the waveguide with the second cladding being set as a reference.

Further, according to another aspect of the present invention, there is provided a laser device including: a gain medium having a gain with respect to an electromagnetic wave to be oscillated; and a resonator structure for resonating the electromagnetic wave, in which the gain medium extends along a propagation direction of the electromagnetic wave and is sandwiched, at a top surface and a bottom surface in a thickness direction thereof, between a first cladding and a second cladding each comprised of a negative dielectric constant medium whose real part of the dielectric constant is negative with respect to the electromagnetic wave to construct a waveguide, and a resistor element for stabilizing a potential difference between the first cladding and the second cladding is provided to a portion where the surface current of the electromagnetic wave to be oscillated is maximum in the first cladding of the waveguide with the second cladding being set as a reference.

Further, according to further another aspect of the present invention, there is provided a laser device including: a gain medium having a gain with respect to an electromagnetic wave having a frequency in the range of from 30 GHz to 30 THz; a resonator structure for resonating the electromagnetic wave; a waveguide formed by interposing the gain medium between a first cladding and a second cladding each comprised of a negative dielectric constant medium whose real part of the dielectric constant is negative with respect to the electromagnetic wave; and a resistor element for stabilizing a potential difference between the first cladding and the second cladding, which is provided to a portion where the surface current is maximum in the first cladding with the second cladding being set as a reference when the electromagnetic wave propagates in the waveguide, in which the waveguide includes an end face to be an open end in a propagation direction of the electromagnetic wave wherein the portion to which the resistor element is provided includes at least a portion separated from the end face by ¼ of the wavelength of the electromagnetic wave in terms of optical length, or includes an end face to be a fixed end in the propagation direction of the electromagnetic wave wherein the portion to which the resistor element is provided includes at least a portion separated from the end face by ½ of the wavelength of the electromagnetic wave in terms of optical length.

Still further, according to further another aspect of the present invention, there is provided a laser device including: a gain medium having a gain with respect to an electromagnetic wave having a frequency in the range of from 30 GHz to 30 THz; a resonator structure for resonating the electromagnetic wave; a waveguide formed by interposing the gain medium between a first cladding and a second cladding each comprised of a negative dielectric constant medium whose real part of the dielectric constant is negative with respect to the electromagnetic wave; and a resistor element for stabilizing a potential difference between the first cladding and the second cladding, which is provided to a portion where the surface current is maximum in the first cladding with the second cladding being set as a reference when the electromagnetic wave propagates in the waveguide, in which the resistor element is formed of a semiconductor and is a film resistor element including a schottky barrier generated between a metal and the semiconductor.

According to the present invention, an oscillation wavelength of a conventional long wavelength laser device can be stabilized, and in addition, a laser oscillation in an operating point, which is conventionally unstable, can be stabilized.

For example, this allows a basic control of the laser oscillation, such as an increase in output of the laser oscillation through selection of an efficient operating point, and a variable operation of the oscillation wavelength through sweeping of the operating point. Along with this control, the present invention can be applied to an application in a frequency range of from 30 GHz to 30 THz ranging from a millimeter wave band to a terahertz wave band, such as a spectral examination used in bio-sensing, or identification of a substance and imaging based thereon.

Further features of the present invention will become apparent from the following description of exemplary embodiments with reference to the attached drawings.

BEST MODE FOR CARRYING OUT THE INVENTION

A first laser device according to the present invention includes a gain medium having a gain with respect to a specific electromagnetic wave, and a resonator structure for resonating the electromagnetic wave. The first laser device has the following features.

Specifically, the gain medium is interposed between a first cladding and a second cladding each comprised of a negative dielectric constant medium whose real part of the dielectric constant is negative with respect to the electromagnetic wave, thereby forming a waveguide. When the electromagnetic wave propagates in the waveguide, a resistor element is provided to a portion where the surface current is maximum in the first cladding with the second cladding being set as a reference. The resistor element in this case is a resistor element for stabilizing a potential difference between the first cladding and the second cladding.

Figure 1A:
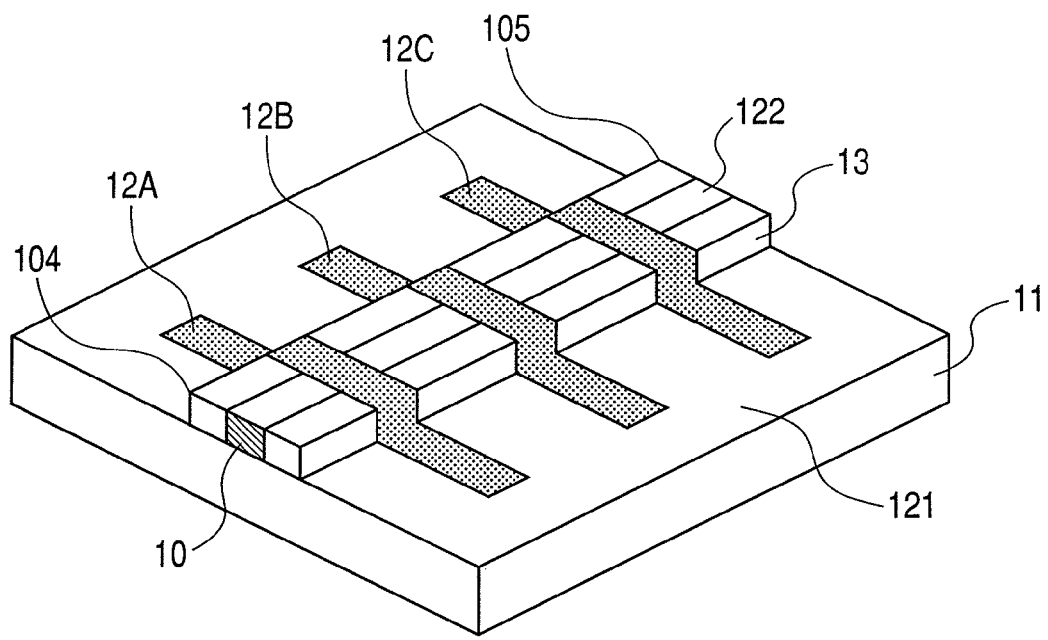
FIGS. 1A and 1B are views illustrating an exemplary embodiment for implementing the present invention.
Figure 1B:
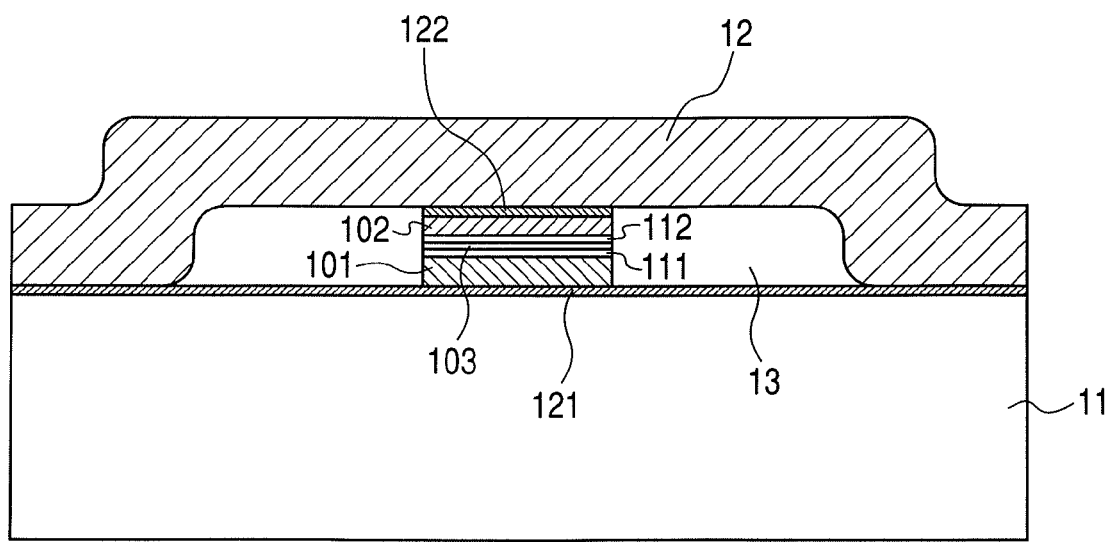

The resistor element itself can be provided to a top portion of the first cladding or a bottom portion of the second cladding (substrate 11 side viewed from second cladding 102 of FIG. 1B).

The waveguide has an end face to be an open end in a propagation direction of the electromagnetic wave. The portion including the resistor element can have such a structure that at least a portion separated from the end face by ¼ of the wavelength of the electromagnetic wave in terms of optical length is included.

The waveguide has an end face to be a fixed end in the propagation direction of the electromagnetic wave. The portion including the resistor element can have such a structure that at least a portion separated from the end face by ½ of the wavelength of the electromagnetic wave in terms of optical length is included.

For example, the resistor element can be structured by a film resistor element formed of a conductive material, or by a semi-metal, a transparent conductive film or a semiconductor. Further, the resistor element is a resistor element including a schottky barrier generated in a metal and the semiconductor.

Note that, in the case where there is a plurality of the portions where the surface current is maximum, it can be employed, a structure in which the resistor elements having different signs of temperature coefficient of resistance are provided to the plurality of the portions where the surface current is maximum.

The negative dielectric constant medium can be comprised of a metal, a carrier-doped semiconductor, or a semiconductor carrier-doped with a metal.

The gain medium can be comprised of a resonant tunneling diode based on photon-assisted tunneling.

For the frequency of the electromagnetic wave, it is suitable to select an electromagnetic wave having a frequency in the range of from 30 GHz to 30 THz.

Hereinafter, a best mode for implementing the present invention is described with reference to the drawings.

FIGS. 1A and 1B illustrate a laser device structure to which the present invention can be applied. FIG. 1A and FIG. 1B are a perspective view and a sectional view of the laser device structure to which the present invention can be applied.

In FIG. 1B, negative dielectric constant media 101 and 102 are substances having a negative real part of a dielectric constant in a frequency range of an electromagnetic wave to be oscillated. In the frequency range of from the millimeter wave band to the terahertz wave band, for example, the negative dielectric constant media 101 and 102 can be comprised of a carrier-doped semiconductor (for example, InAs, InP, GaAs, and Si), a metal (for example, Ag, Au, Cu, and Al), or a combination of those substances.

In FIG. 1B, a gain medium 103 is vertically sandwiched by the negative dielectric constant media 101 and 102. Generally, the gain medium is a substance which produces a gain when carriers are injected thereto. In order to perform current injection from the outside, an electrical contact between the gain medium 103 and the negative dielectric constant media 101 and 102 needs to be acquired. Therefore, a semiconductor which is carrier-doped at high density is used as electrical contacts 111 and 112. In this case, the high density is assumed to be at least a higher density than such a carrier density that the real part of a dielectric constant is negative.

In FIG. 1B reference numerals 121 and 122 denote electrodes.

With this structure, the negative dielectric constant media 101 and 102 and the electrical contacts 111 and 112 function as a cladding forming a geometrical-optical reflective surface for the electromagnetic wave of the millimeter wave band or the terahertz wave band. Therefore, in the electromagnetic wave guided by such a cladding (negative dielectric constant media 101 and 102 and electrical contacts 111 and 112), the surface plasmon having no diffraction limit is permitted as a waveguide mode. As a result, limitation in thickness of the gain medium 103 is reduced, which is suitable for a long wavelength laser.

Incidentally, the surface plasmon propagating along such cladding (negative dielectric constant media 101 and 102 and electrical contacts 111 and 112) propagates while involving a carrier fluctuation within the cladding. Therefore, when the carrier fluctuation within the cladding can be controlled, it is conceived that the surface plasmon itself can be controlled.

As a control method for charge carriers, a method of imparting potential to a space portion in advance is conceivable as in a grid in a vacuum tube. On the other hand, in a laser, the electromagnetic wave generally forms a standing wave in the resonator structure. When a certain oscillation wavelength is considered, space potential of the resonator structure is made constant in terms of time. This relationship is greatly convenient in the long wavelength laser with the surface plasmon waveguide, and thus control of a laser oscillation positively utilizing such relationship can be conceived. In other words, when an electrode or the like is inserted to a portion to become a node or a portion to become an anti-node of the electromagnetic wave in the cladding (negative dielectric constant media 101 and 102 and electrical contacts 111 and 112), the laser oscillation can be controlled.

Further, when an electrode to be inserted is replaced with a structure with a finite electrical resistance, control of the operating point in the current injection is also enabled. For this reason, a resistor element 12 is provided. As described later, for the control of the operating point, the electrical resistance of the resistor element 12 is generally preferred to be a relatively small value.

The resistor element 12, which is a relatively low resistor, works to make constant the potential of the portion where the resistor element 12 is inserted. Therefore, the portion to become the node of the electromagnetic wave to be oscillated in the surface plasmon waveguide is carefully selected to insert the resistor element 12.

In this case, when the portion to become the node of the electromagnetic wave is considered in terms of the relationship between the potential of the first cladding with the second cladding as a reference in the waveguide and the surface current, the portion to become the node of the electromagnetic wave is regarded as the portion where the surface current is maximum. The first cladding is comprised of the negative dielectric constant medium 101 and the electrical contact 111. The second cladding is comprised of the negative dielectric constant medium 102 and the electrical contact 112. The electrical contacts 111 and 112 can be omitted as necessary.

As a matter of course, the portion to become the node of the electromagnetic wave may be regarded as the portion where the surface current is maximum in terms of the relationship between the potential of the second cladding with the first cladding as a reference and the surface current. Alternatively, when the electromagnetic wave which is not allowed to be oscillated is considered, the resistor element 12 is assumed to be inserted to a portion where the surface current is not maximum (for example, anti-node of electromagnetic wave). In other words, the resistor element 12 works to make the space potential constant and thus works as a loss for the electromagnetic wave which is not allowed to be oscillated. In the exemplary embodiment to which the present invention can be applied, the resistor element 12 stabilizes the oscillation wavelength using the phenomenon as described above.

As the gain medium 103, for example, a resonant tunneling diode may be used. A semiconductor multi-layered film structure with several hundred to several thousand layers, being used in a quantum cascade laser, may be used. The resonant tunneling diode and the semiconductor multi-layered film structure generate an electromagnetic wave gain in the electromagnetic wave of the millimeter wave band or the terahertz wave band through the current injection. Note that, when the current injection is performed, the tunnel injection is involved and the I-V characteristics in the vicinity of the operating point where the gain is generated has a negative differential resistance region. The negative differential resistance region is an unstable branch as described by a van del pol equation which is a nonlinear differential equation. Therefore, when the gain medium 103 as described above is selected, the stabilization for setting a desired operating point is indispensable. In order to stabilize the instability in the negative differential resistance region, a method is conceived in which a resistor having a lower resistance than the negative differential resistance is inserted in parallel to serve as a passive circuit as a whole, as well known in the electronic device technology. The resistor element 12 in the exemplary embodiment to which the present invention can be applied takes such a role.

In FIG. 1A, the resonator structure is formed by end faces 104 and 105. As illustrated in FIG. 1A, in the case where a treatment of the end faces is not performed, the end faces are open ends. Therefore, portions of the end faces 104 and 105 serving as the open ends have a minimum surface current in such a waveguide resonator. This is an ultimate approximation where a parasitic reactance component in the end faces 104 and 105 is ignored. In a typical case, the ultimate approximation is satisfactory. In this case, the first portion along the waveguide from the end faces 104 and 105 at which portion the surface current is maximum is a portion separated by $\lambda/4$ in terms of optical length with the oscillation wavelength as $\lambda$. This corresponds to $\pi/2$ in terms of electrical length. After that, similarly to a distributed constant circuit, an equivalent portion constantly appears for every $\lambda/2$ in terms of optical length (for every $\pi$ in terms of electrical length). Alternatively, when a treatment is performed on the end faces so that the first cladding (negative dielectric constant medium 101 and electrical contact 111) and the second cladding (negative dielectric constant medium 102 and electrical contact 112) in the end faces are short-circuited, the end faces become fixed ends. In this case, the end faces 104 and 105 serving as the fixed ends have a maximum surface current in such a waveguide resonator. At this time, the first portion with the maximum surface current along the waveguide from the end faces 104 and 105 is a portion separated by $\lambda/2$ in terms of optical length with the oscillation wavelength as $\lambda$. This corresponds to $\pi$ in terms of electrical length. After that, similarly to the distributed constant circuit, an equivalent portion constantly appears for every $\lambda/2$ in terms of optical length (for every $\pi$ in terms of electrical length). In any cases described above, the resistor element 12 is inserted into a portion where the surface current of the electromagnetic wave to be oscillated in the surface plasmon waveguide is maximum. Note that the number of the resistor element 12 to be inserted may be one at minimum, but it is preferred to use multiple resistor elements in order to secure sufficient stabilization.

The resistor element 12 may be inserted between the first cladding (negative dielectric constant medium 101 and electrical contact 111) and the second cladding (negative dielectric constant medium 102 and electrical contact 112) of the negative dielectric constant. For example, as illustrated in FIG. 1B, the resistor element 12 is inserted via the electrodes 121 and 122. As a matter of course, without being limited to this, the negative dielectric constant media 101 and 102 may be drawn in a lateral direction to be directly electrically connected to the resistor element 12. In any case, the resistor element 12 may be so constructed as not to be brought into contact with a side wall of the gain medium 103. A region 13 is provided for passivation and is filled with dielectrics as illustrated in FIG. 1B. A dielectric with a low dielectric constant and a low loss or air gap with substantially no loss can be employed.

As the structure of the resistor element 12, a conductive material which is likely to realize a relatively low resistance value can be employed. For example, a semi-metal such as Bi or graphite and a transparent conductive film such as ITO, ZnO, or ZnSn are conceivable. Further, a semiconductor such as poly-Si which has a relatively high electrical conductivity may be employed. When those materials are used as a film resistor element 12 formed on the body of a device 10, the parasitic reactance can be reduced, which is preferred to be made monolithic. The film resistor elements 12 may be different from each other in material or shape, and expressed as 12A, 12B, 12C, etc. as illustrated in FIG. 1A in general. For example, the film resistor elements 12A and 12C may be semi-metals having such a temperature coefficient of resistance that the electrical conductivity is reduced as the temperature is increased, or may be a semiconductor having such a temperature coefficient of resistance that the electrical conductivity is increased as the temperature is increased. This is because Joule heat may be generated due to the current for stabilization according to the resistance value of the film resistor elements 12, but a compensation method therefor can also be conceived. A transparent semiconductor can be employed in both usages. The resistor element 12 is not limited thereto, and a nonlinear resistor element which can suppress the current itself flowing for stabilization may be used as described later.

Such a laser device may be driven by connecting the electrodes 121 and 122 to an external electrical field control unit (not illustrated). Note that, for current injection to the gain medium 103 and for stabilization, the current flowing through the resistor element 12 may be taken into consideration to use the external electrical field control unit with a sufficient driving capability.

A more specific structure is described in the following embodiments.

Embodiment 1

Figure 2A:
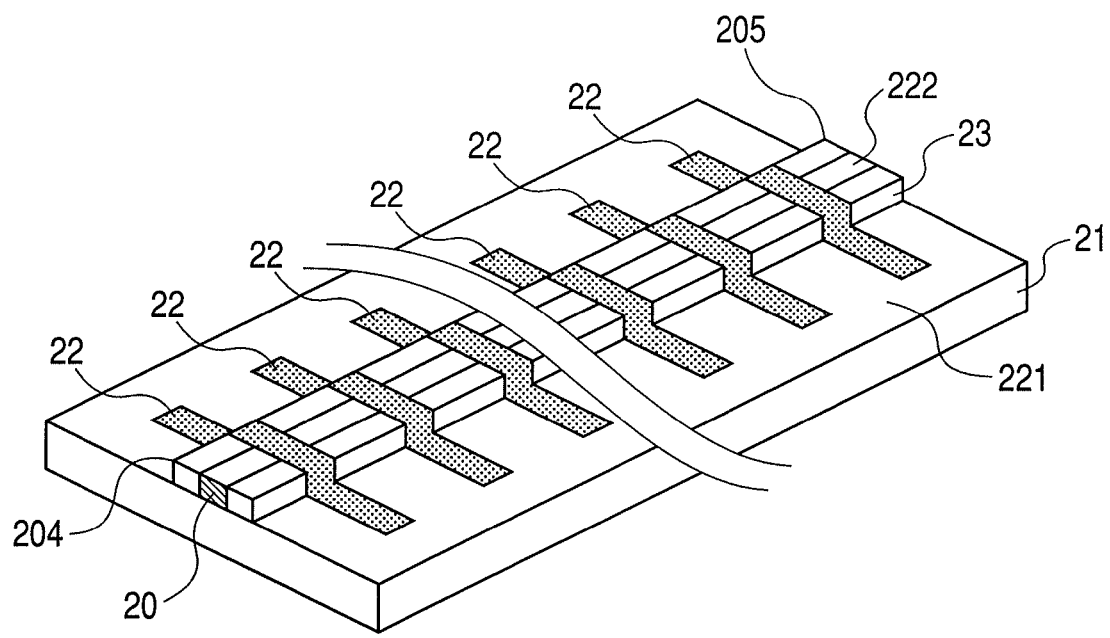
FIGS. 2A and 2B are views illustrating a laser device structure according to Embodiment 1 of the present invention.
Figure 2B:
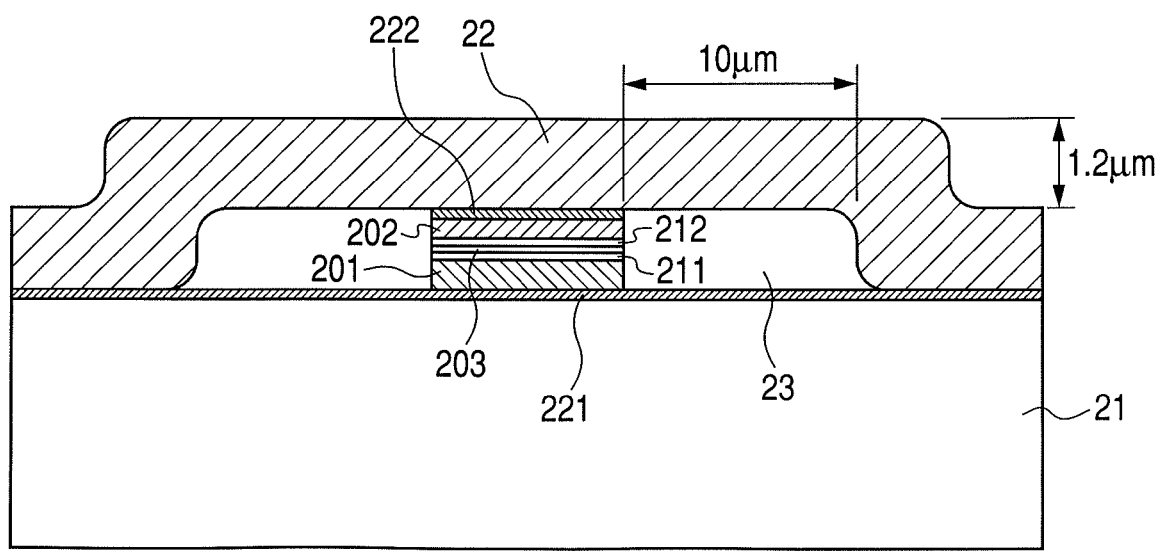

FIGS. 2A and 2B illustrate an embodiment of a laser device to which the present invention can be applied. In this embodiment, the gain medium is a resonant tunneling diode (RTD). The gain generated in the RTD is assumed to range from the millimeter wave band to the terahertz wave band. In the RTD, a tunnel injection is used as a method for the current injection, and a negative differential resistance region appears in the I-V characteristics. In the RTD, the operating point where the gain is generated overlaps with the negative differential resistance region, and the operating point is generally unstable. Therefore, the stabilization of the laser oscillation is necessary, which leads to a satisfactory example of a gain medium constituting a laser device to which the present invention can be applied.

FIG. 2B illustrates a sectional view of the laser device structure in this embodiment. A gain medium 203 is an RTD, which has a structure using three barrier layers such as spacer layer/barrier layer/well layer/barrier layer/well layer/barrier layer/spacer layer. For those layers, InGaAs which shows lattice-matching on an InP substrate may be used as the well layer, and InAlAs which shows lattice-matching, AlAs which does not show lattice-matching, or Sb-based AlGaAsSb may be used as the barrier layer. More specifically, from the emitter side to the collector side, a semiconductor multi-layered film structure is constructed as follows: InGaAs 5.0 nm/AlAs 1.3 nm/InGaAs 5.6 nm/InAlAs 2.6 nm/InGaAs 7.6 nm/AlAs 1.3 nm/InGaAs 5.0 nm. Each of the layers is an undoped layer to which carrier-doping is not performed intentionally. When the carriers (in this case, electrons) which are tunnel-injected from the emitter pass through the above-mentioned semiconductor multi-layered film structure, the carriers generate a gain in the frequency range of from the millimeter wave band to the terahertz wave band based on a phenomenon called photon-assisted tunneling. Further, when applying an electrical field of 0.7 V, the peak current density is about 280 kA/cm$^2$, and at an electrical field of 0.7 to 0.9 V, a negative differential resistance is found.

In more detailed analysis, for example, when applying an electrical field of 0.7 V to be the operating point, it is assumed that a gain of about 600 cm$^{-1}$ is obtained in the frequency range of from 0.3 THz to 1 THz. Note that, for analysis of the RTD, Jpn. J. Appl. Phys., Vol. 40, 5251 (2001) was referred to.

The gain medium 203 as described above is sandwiched by electrical contacts 211 and 212 which are also negative dielectric constant media. The electrical contacts 211 and 212 of the gain medium 203 are structured by, for example, a semiconductor film of 50 nm n-InGaAs which shows lattice-matching to the InP substrate. Here, electrons are selected as carriers and Si is used as dopants, thereby setting the electron concentration to 2×10$^{18}$ cm$^{-3}$. Further, the gain medium 203 is sandwiched by the electrical contacts 211 and 212 serving as negative dielectric constant media, and is also a semiconductor film of 100 nm n-InGaAs which shows lattice-matching to the InP substrate. In this case, the electron concentration is set to 1×10$^{19}$ cm$^{-3}$ to be ohmically contacted with electrodes 221 and 222 of Ti/Pd/Au or the like. Note that, an example of the structure on the InP substrate has been described above, and the present invention is not limited thereto. A semiconductor multi-layered film structure such as InAs/AlAsSb or InAs/AlSb on an InAs substrate, GaAs/AlAs or GaAs/AlGaAs on a GaAs substrate, or Si/SiGe on an Si substrate can be conceived. A device body 20 thereof is transferred on a transfer substrate 21 illustrated in FIG. 2A and have an embedded structure where the device body 20 is embedded in a dielectric 23. As the dielectric 23, a material such as BCB with a low dielectric constant and a less loss is selected. As a result, a resistor element 22 can be inserted between the electrodes 221 and 222 without contacting the side wall of the gain medium. Besides, the resistor element 22 can be drawn on the dielectric 23 to adjust the length thereof, thereby adjusting the resistance value of the resistor element 22. In this case, the size of the device body 20 is set to 300 μm in a propagation direction of the surface plasmon and 5 μm in a lateral direction. FIG. 2A also illustrates end faces 204 and 205.

In the laser device structure described above, the resistor element 22 is inserted between the first cladding (negative dielectric constant medium 201 and electrical contact 211) and the second cladding (negative dielectric constant medium 202 and electrical contact 212), which have a negative dielectric constants, via the electrodes 221 and 222. In this embodiment, as a material of the resistor element 22, a semi-metal Bi is used to form a ribbon-like film. According to the measurement result obtained when the Bi was formed by a deposition method, the resistivity was about 3Ω·μm. Therefore, the Bi-film resistor element 22 which is relatively easy to be manufactured can be arbitrarily adjusted to have a resistance value of about from several Ω to several ten Ω. The resistance value R is set as follows (Formula 1) so that the Bi-film resistor element 22 can be almost ignored in terms of the oscillation wavelength.

$$Zin < R \quad \text{(Formula 1)}$$

Here, Zin is a magnitude of an input impedance of a portion where the surface current is maximum in the surface plasmon waveguide on which the Bi-film resistor element 22 is arranged. The Zin of this portion is sufficiently smaller than the characteristic impedance Z0 in the surface plasmon waveguide of the device body 20 (Zin<Z0). Therefore, when a resistance value larger than Z0 is selected, Formula 1 can be satisfied. On this occasion, when the characteristic impedance Z0 in the surface plasmon waveguide is analyzed in detail, Z0 is about 0.1Ω in 0.3 THz to 1 THz. Note that, as for an analysis method for the surface plasmon waveguide, a finite element method solver of the Maxwell equations is used by reflecting free-carrier concentrations of the respective layers in the device body 20 on a complex dielectric constant model given by Drude as well known. In this embodiment, as described in FIG. 2B, the ribbon-like Bi-film resistor element 22 having a side with a thickness of 1.2 μm, a width of 4 μm, and a length on the dielectric 23 of 10 μm is arranged at both sides of the device body 20 so as to cross the device body 20, thereby adjusting the resistance value R to about 3Ω. As described above, an impedance mismatch between the magnitude Zin of the input impedance at the portion where the surface current is maximum and the resistance value R of the Bi-film resistor element 22 is ensured. For the arrangement method, in the case of this embodiment, the end faces 204 and 205 are open ends, and therefore portions separated from the end faces 204 and 205 by an optical length of λ/4 are first portions where the surface current is maximum. Therefore, a method is selected in which the resistor elements 22 are partially arranged at a pitch of λ/2 in a propagation direction from those portions. When the optical length neL is used (equivalent refractive index ne, physical length L), the equivalent refractive index in the surface plasmon waveguide is obtained, and the oscillation wavelength is determined, the pitch of the physical length is obtained. In this case, the equivalent refractive index in the surface plasmon waveguide is about 12 in the vicinity of 0.3 THz to 1 THz (the above-mentioned technique was used for the analysis of the surface plasmon waveguide). In this embodiment, 1 THz is selected. On this occasion, the optical length λ/2 corresponds to 12.5 μm in terms of physical length. Further, in order to stabilize the operating point of the device body 20, the following condition (Formula 2) is to be satisfied.

$$r \leq -NDR \quad \text{(Formula 2)}$$

Here, NDR (<0) is a value of a negative differential resistance of the device body 20 at the operating point, and r is a sum of resistances of the resistor elements 22 which are arranged parallel to each other on the device body 20. On this occasion, the NDR per area at the operating point of the gain medium 203 is about −2×10$^{-6}$ Ω·cm$^2$, and the NDR per 12.5 μm in the propagation direction is about −3.2Ω. When the resistance is relatively low as described above, a large number of resistor elements 22 may be arranged in parallel to each other. In this embodiment, for example, the resistor elements 22 are arranged at portions where all the surface currents in the surface plasmon waveguide are maximum. If it is equal to or smaller than 3.2Ω in terms of one resistor element 22, Formula 2 can be satisfied, which condition is satisfied in this case. Accordingly, twenty-four Bi-film resistor elements 22 are arranged on the device body 20.

In the laser device structure described above, a calculation for confirming the stabilization of the laser oscillation in the vicinity of the oscillation wavelength and a calculation for confirming the stabilization of the operating point in the vicinity of the DC were performed. In reality, it is considered that the stabilization is effective if effects of the loss due to the Bi-film resistor element 22 are found in the entire frequency range excluding the oscillation wavelength of 1 THz. However, it is conceived that a sufficient calculation can be performed in two major frequency ranges for convenience.

Figure 3A:
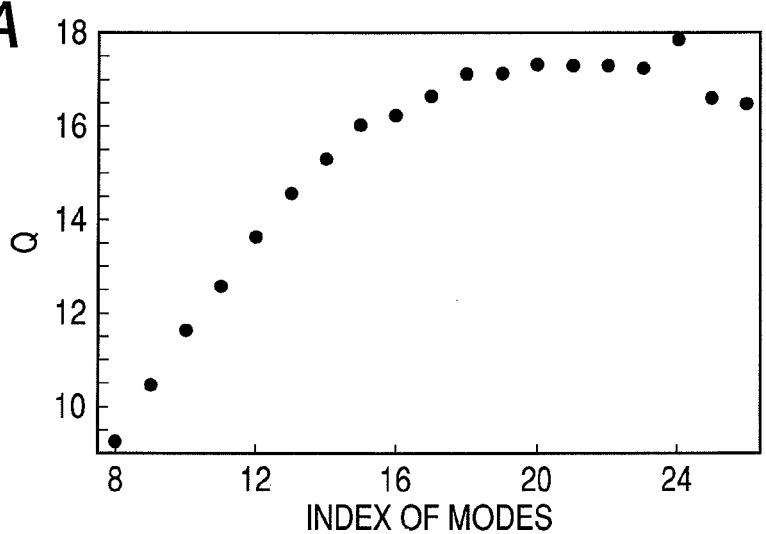
FIGS. 3A, 3B, and 3C are graphs for indicating that in Embodiment 1 of the present invention an oscillation wavelength of a laser oscillation is stabilized by a resistor element to which the present invention can be applied.
Figure 3B:
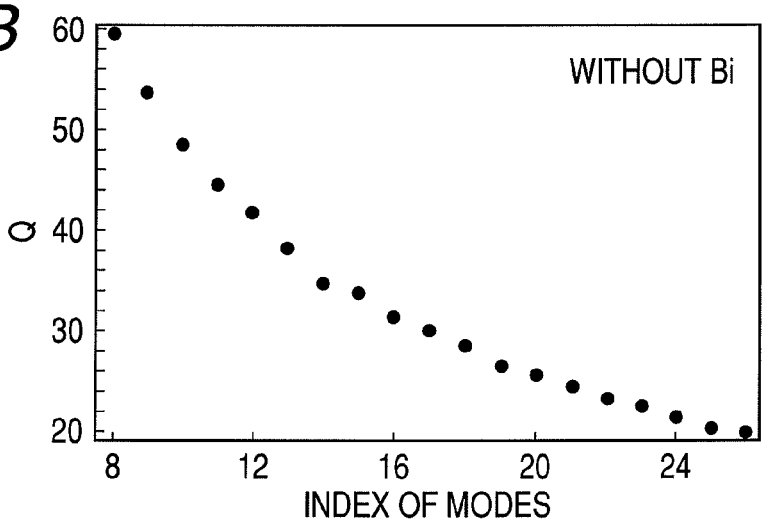
Figure 3C:
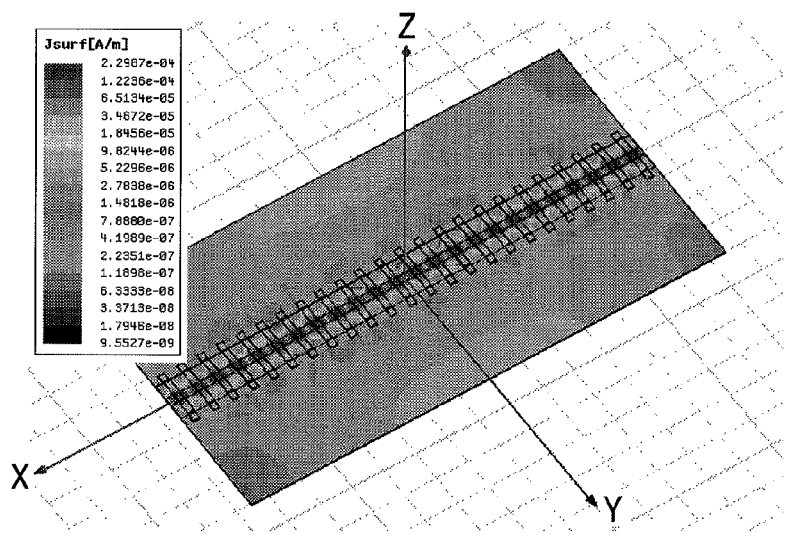

FIGS. 3A, 3B, and 3C illustrate calculation results of the Q value in the vicinity of the oscillation wavelength.

In the calculation, the entire electromagnetic field simulation is performed with the laser device structure of this embodiment. In the entire electromagnetic field simulation, a commercially available HFSS ver. 10.1 manufactured by Ansoft Corporation, which is known as a three-dimensional finite element method solver, was used.

Further, as a method of specifying the negative dielectric constant material, the complex dielectric constant model by Drude is approximated and used. The approximation is performed by replacing an AC conductivity σ (ω) in the complex dielectric constant model of Drude with a DC conductivity σ (0).

It is known that, when a relationship between an angular frequency ω to be resolved and a relaxation time τ of carriers in the negative dielectric constant material satisfies ωτ<1, a better approximation is obtained.

Here, a frequency range where a simulation is performed is set to the vicinity of 0.3 to 1 THz.

It is known that when the electron relaxation time τ in electrode materials 201 and 202 is set to 0.05 psec and the electron relaxation time τ in n-InGaAs semiconductor materials 201, 202, 221, and 222 is set to 0.1 psec, modeling can be achieved. As for the relaxation time, Appl. Phys. Lett., Vol. 83, 2124 (2003) was referred to.

Therefore, by employing the relaxation time of Appl. Phys. Lett., Vol. 83, 2124 (2003), all the n-InGaAs semiconductor materials 201, 202, 221, and 222 have σ(0)=6×10$^5$ S/m. Note that the background dielectric constant of the InGaAs semiconductor materials is assumed to be 11.6, and thus the dielectric constant of an i-InGaAs semiconductor material 203 is set to be the background dielectric constant per se.

Further, for simplification of the calculation scale, a mesh is not used within the electrode materials 201 and 202, and the DC conductivity σ (0) is sufficiently made large so as to approximate only the surface current.

A calculation is conducted under the above modeling. FIG. 3A indicates calculation results. In FIG. 3A, a peak of the Q value is in the 24th mode (longitudinal mode) and Q values in the other modes are relatively smaller. Accordingly, the 24th mode is selected in the laser oscillation and the oscillation wavelength is therefore stable. Further, the oscillation wavelength corresponding to the 24th mode was 1.05 THz.

It is considered that those results are obtained by inserting the Bi-film resistor element 22 into the portion where the surface current is maximum as described above to give a loss to the modes other than the mode of a desired laser oscillation.

FIG. 3B indicates calculation results for comparison obtained when the Bi-film resistor element 22 is not inserted. The 24th mode is not so much affected by the Bi-film resistor element 22, which is apparent by comparing FIGS. 3A and 3B. This varies depending on the width of the Bi-film resistor element 22. FIG. 3C is a perspective view of an analytical model which was used in the entire electromagnetic field simulation, and simultaneously indicates a surface current distribution of the 24th mode in a boundary between the electrode material 221 and the n-InGaAs semiconductor material 201. In the entire electromagnetic field simulation, the Bi-film resistor element 22 is visualized which is arranged at a portion where the surface current distribution is large.

Figure 4:
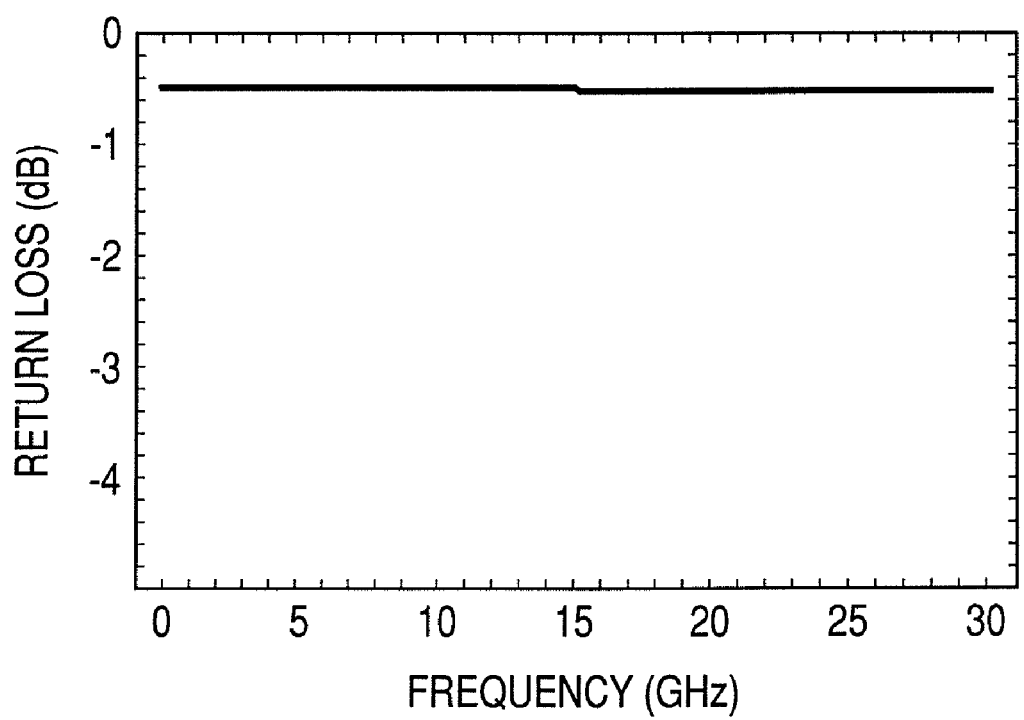
FIG. 4 is a graph for indicating that in Embodiment 1 of the present invention an operating point of the laser oscillation is stabilized by the resistor element to which the present invention can be applied.

FIG. 4 indicates calculation results of a return loss around the DC. In the calculations, an S-parameter analysis was performed on the assumption that the laser device structure of this embodiment is a lumped constant circuit and the electrodes 221 and 222 are integrated into one port.

This is considered to be proper because the size of the device body 20 is sufficiently small in a conceivable frequency range (around the DC in this case).

Here, in addition to the NDR of the device body 20 and the combined resistance r of the Bi-film resistor element 22, the ohmic contact resistance (1×10$^{-7}$ Ω·cm$^2$) through Ti/Pd/Au electrodes 221 and 222 is taken into consideration. Further, the electrostatic capacity (the dielectric constant of the BCB 23 was assumed to be 2.6) of the Bi-film resistor element 22 is also taken into consideration.

As is apparent from calculation results of FIG. 4, in the entire frequency range of DC to 30 GHz, the return loss is equal to or smaller than 0 dB, and thus the operating point is stable. The results can generally be obtained when the Bi-film resistor element 22 is inserted so that Formula 2 is satisfied.

The laser device structure of this embodiment can be manufactured by the following method.

First, the following layers are manufactured on an InP substrate by a molecular beam epitaxy (MBE) method or the like.

n-InGaAs layers 202 and 212, a multiple quantum well 203 of InGaAs/AlAs or InGaAs/InAlAs, and n-InGaAs layers 211 and 201 are epitaxially grown.

The Ti/Pd/Au electrode 221 is deposited on a surface of the InP substrate and etching is performed up to the substrate to have a mesa shape with a width of 5 μm and a length of 300 μm as described above. For the etching, photolithography and dry etching by inductively coupled plasma (ICP) are used. Next, a pressure bonding is performed between the above-mentioned Ti/Pd/Au electrode 221 and an AU thin film formed on a transfer substrate 21 with an Au thin film deposited thereon. Thermal fusion bonding using a solder such as AuSn may be used. Then, wet etching is performed with a hydrochloric acid to selectively remove the InP substrate. Therefore, a mesa-shaped epitaxial layer is transferred on the transfer substrate 21. Then, after the BCB 23 is applied by spin coating, the mesa-shaped epitaxial layer is exposed. Further, on a surface of the n-InGaAs layer 202 which is exposed after the InP substrate is removed, an electrode 222 is formed by a lift-off method. Finally, the Bi-film resistor element 22 is deposited by the lift-off method to complete the structure describe above.

Note that, as a modification of the film resistor element of this embodiment, a transparent conductive film which has a relatively close resistivity is also conceivable other than a semi-metal such as Bi. In this embodiment, ITO or ZnO having such a relatively close resistivity may be used as a similar shaped film.

Embodiment 2

Figure 5A:
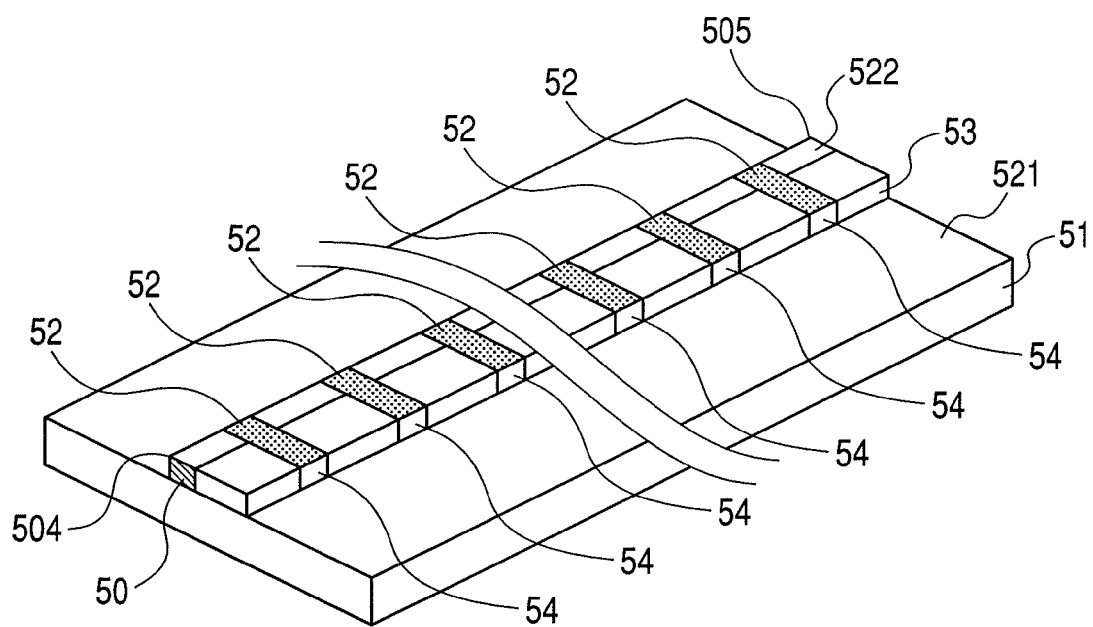
FIGS. 5A and 5B are views illustrating a laser device structure according to Embodiment 2 of the present invention.
Figure 5B:
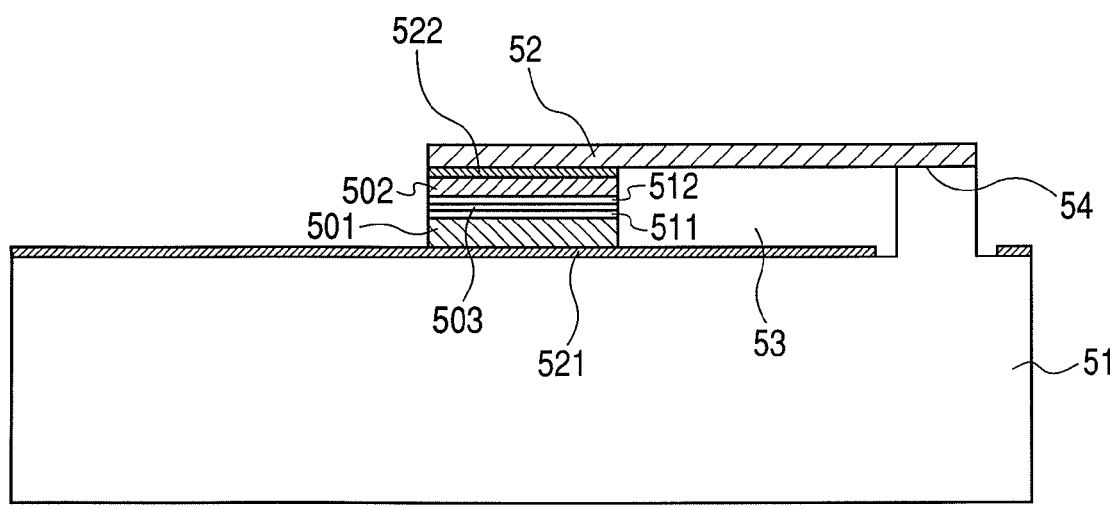

FIGS. 5A and 5B illustrate an embodiment of a laser device to which the present invention can be applied. In this embodiment, the gain medium is the same resonant tunneling diode (RTD) as that of Embodiment 1. The NDR of the RTD of Embodiment 1 is a relatively low resistance, and therefore the resistance value of the resistor element used for the stabilization is also relatively low. For example, it has been such that a single resistor element consumes extra current of the 100 mA order. Note that the resistor element is not limited to a linear resistor element, but a nonlinear resistor element may be used. In this embodiment, in order to achieve improvement to this problem, is used a nonlinear resistor element which uses schottky barrier formed on the boundary between a metal and a semiconductor. The structure thereof is somewhat complicated, but it is a more desired example as a resistor element which constructs a laser device to which the present invention can be applied.

In FIG. 5B, a gain medium 503 is assumed to be the same RTD formed on an InP substrate as that of Embodiment 1 for simplification. Electrical contacts 511 and 512 are comprised of semiconductor films of 50 nm n-InGaAs having an electron concentration of $2 \times 10^{18}$ cm$^{-3}$. Negative dielectric constant media 501 and 502 are comprised of semiconductor films of 100 nm n-InGaAs having an electron concentration of $1 \times 10^{19}$ cm$^{-3}$. Further, Ti/Pt/Au is used as electrodes 521 and 522. A device body 50 including those layers described above is transferred on a transfer substrate 51 illustrated in FIG. 5A and have an embedded structure where the device body 50 is embedded by a dielectric 53. Further, in this embodiment, a schottky barrier is used as a nonlinear resistor element. Therefore, an n-Si substrate with a resistivity of about 1 Ω·cm is used for the transfer substrate 51. For the n-Si substrate 51, electrode materials for constructing a schottky electrode are well known in the electronic device technology, and thus some electrode materials can be selected. A schottky electrode material 52, which is a ribbon-like film, electrically connects a portion of the surface of the n-Si substrate 51 to become a schottky barrier 54 to the electrode 522 formed on the device body 50. Such a resistor element 52 including the schottky barrier 54 comes in electrical contact with the electrodes 521 and 522. In this case, the size of the device body 50 is set to 300 μm in a propagation direction of the surface plasmon and 5 μm in the lateral direction. Further, a surface area of the schottky barrier 54 is set to, for example, 4 μm square.

In the laser device structure described above, the resistor element 52 including the schottky barrier 54 is inserted between the first cladding (negative dielectric constant medium 501 and electrical contact 511) and the second cladding (negative dielectric constant medium 502 and electrical contact 512), which have negative dielectric constants, via the electrodes 521 and 522. Note that, regarding the resistance value of the resistor element 52 including the schottky barrier 54, Formula 1 is the same as in Embodiment 1, but Formula 2 is different from that of Embodiment 1. Specifically, the resistance value R at the operating point is set as follows so that the resistor element 52 including the schottky barrier 54 can be almost ignored in terms of the oscillation wavelength.

$$Zin < R \quad \text{(Formula 1)}$$

Further, in order to stabilize the operating point of the device body 50, the following condition (Formula 3) is to be satisfied.

$$DR \leq -NDR \quad \text{(Formula 3)}$$

Figure 6A:
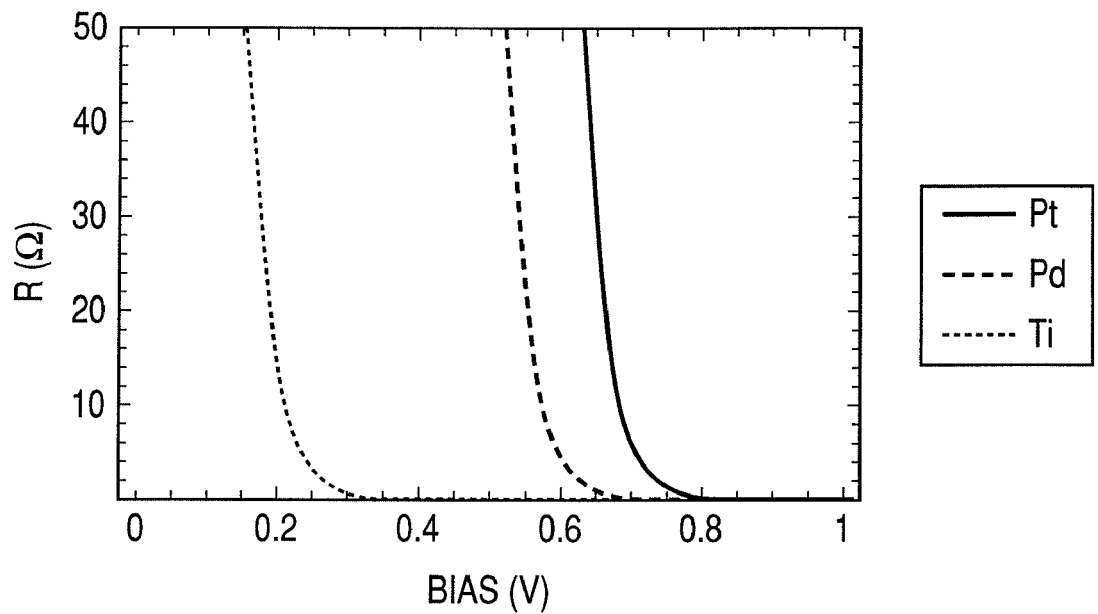
FIGS. 6A and 6B are graphs for describing a nonlinear resistor element to which the present invention can be applied in Embodiment 2.
Figure 6B:
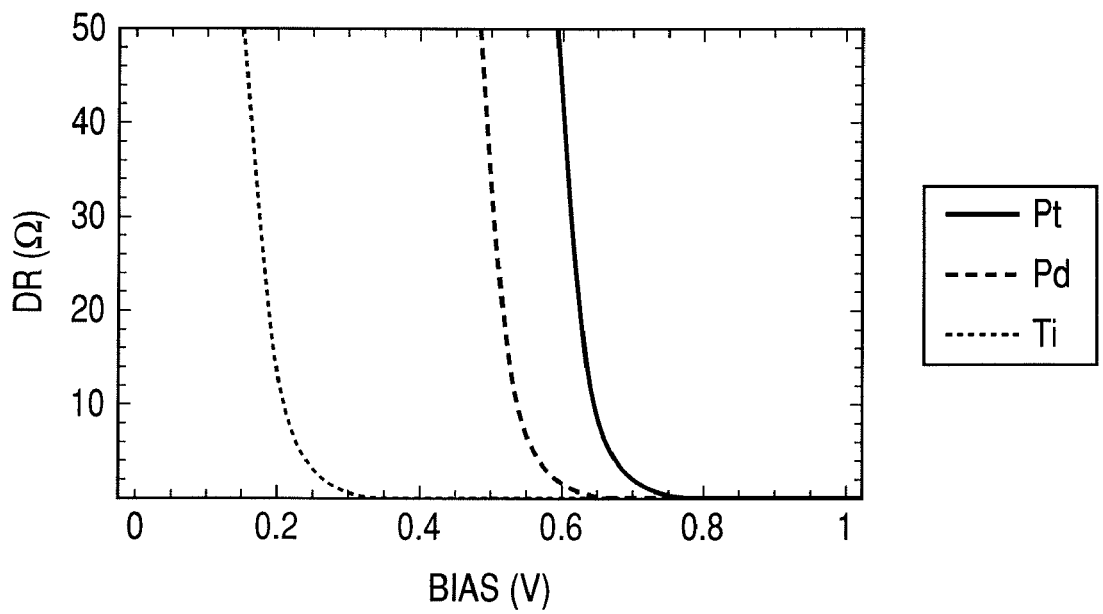

Here, the NDR (<0) is a value of a negative differential resistance of the device body 50 at the operating point, and DR is a sum of differential resistances of the resistor elements 52 at the operating point, which include the schottky barrier 54 and are arranged parallel to each other on the device body 50. Expression 2 can be assumed to be a formula obtained by further generalizing Formula 2. In order to satisfy it, the schottky electrode material 52 was examined to obtain calculation results illustrated in FIGS. 6A and 6B. In the calculations, a well-known thermionic-field emission model was used. Here, the schottky barrier heights with respect to the n-Si substrate 51 for Pt, Pd, and Ti were assumed to be 0.9 eV, 0.8 eV, and 0.5 eV, respectively. Further, as for the n value (ideal factor) of the boundary of the schottky barrier 54, a typical value 1.1 was assumed. In FIG. 6A, at an operating point of 0.7 V, when Pt is used for the schottky electrode material 52, the resistance value R is about 10Ω. In FIG. 6B, at an operating point of 0.7 V, when Pt is used for the schottky electrode material 52, the differential resistance DR per resistor element 52 including the schottky barrier 54 is about 1Ω. Therefore, Pt can be used for the schottky electrode material 52 to simultaneously satisfy Formulae 1 and 3. When twenty-four schottky electrode materials 52 made of Pt are arranged on the device body 50 at a pitch of 12.5 μm as in Embodiment 1, the laser oscillation with an oscillation wavelength of about 1 THz is stabilized.

In this embodiment in which the nonlinear resistor element is used, a single resistor element consumes extra current of the 10 mA order for stabilization of the laser oscillation. This is smaller than that of Embodiment 1 and can be considered to be a suitable modification.

The laser device structure of this embodiment can be manufactured by the following method. First, the following layers are manufactured on the InP substrate by the molecular beam epitaxy (MBE) method or the like.

n-InGaAs layers 502 and 512, a multiple quantum well 503 of InGaAs/AlAs or InGaAs/InAlAs, and n-InGaAs layers 511 and 501 are epitaxially grown.

Ti/Pt/Au electrode 521 is deposited on a surface of the InP substrate and etching is performed up to the substrate to have a mesa shape with a width of 5 μm and a length of 300 μm as described above. For the etching, photolithography and dry etching by inductively coupled plasma (ICP) are used. Further, etching is performed on the n-Si transfer substrate 51 in a mesa shape of 4 μm square, and a Ti/Au thin film is deposited on a portion which has been subjected to the etching. Next, a pressure bonding is performed between the above-mentioned Ti/Pt/Au electrode 521 and the Ti/Au thin film formed on the n-Si transfer substrate 51. Thermal fusion bonding using a solder such as AuSn may be used. Then, wet etching is performed with a hydrochloric acid to selectively remove only the InP substrate. Therefore, a mesa-shaped epitaxial layer is transferred on the n-Si transfer substrate 51. Then, after BCB 53 is applied by spin coating, the mesa-shaped epitaxial layer is exposed. Further, on a surface of the n-InGaAs layer 502 which is exposed after the InP substrate is removed, an electrode 522 is formed by the lift-off method. Finally, the schottky electrode material 52 made of Pt is deposited by the lift-off method to complete the structure describe above.

Embodiment 3

Figure 7A:
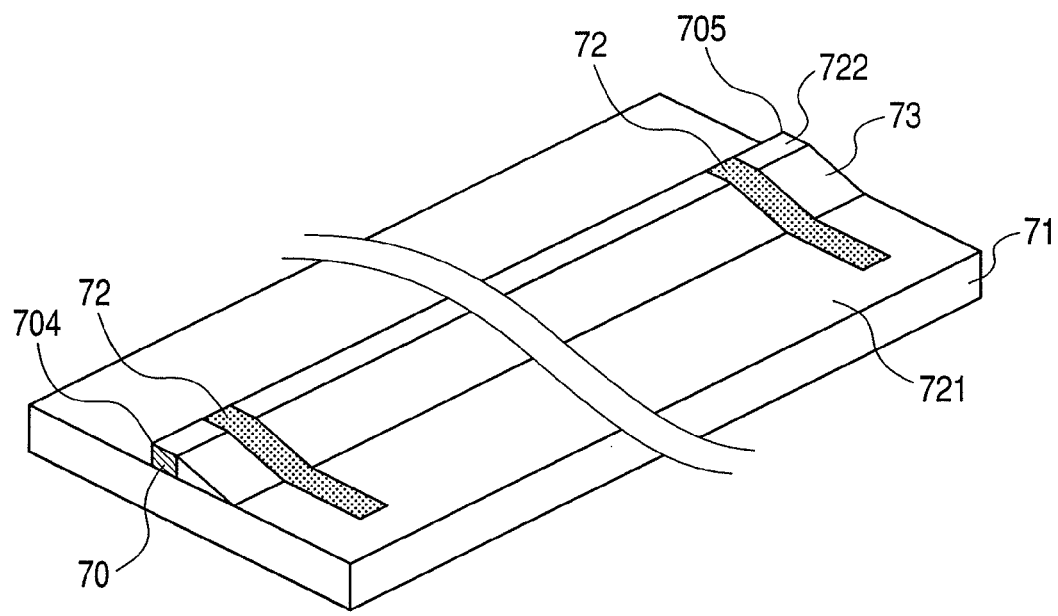
FIGS. 7A and 7B are views illustrating a laser device structure according to Embodiment 3 of the present invention.
Figure 7B:
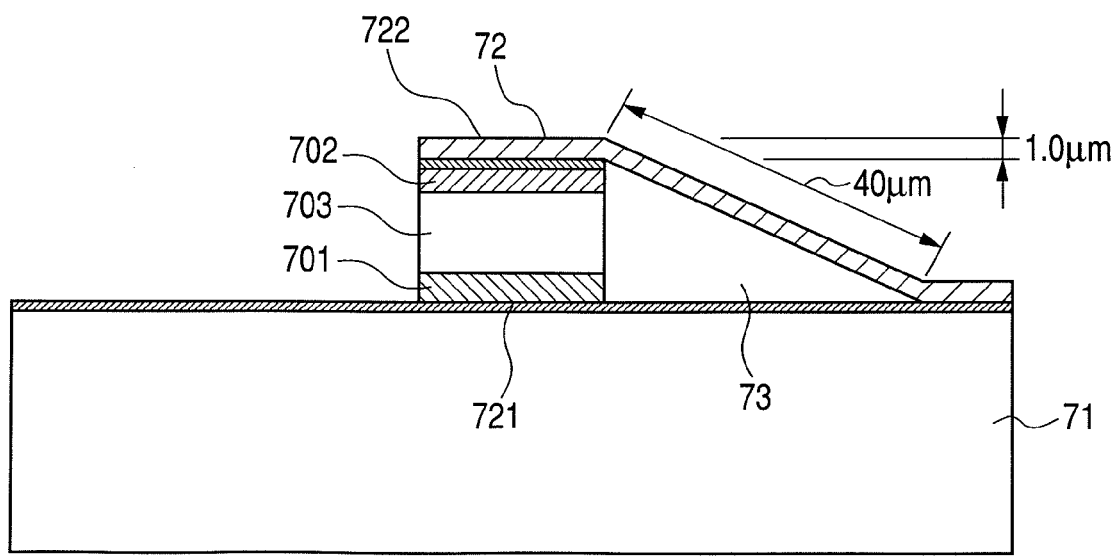
Figure 8:
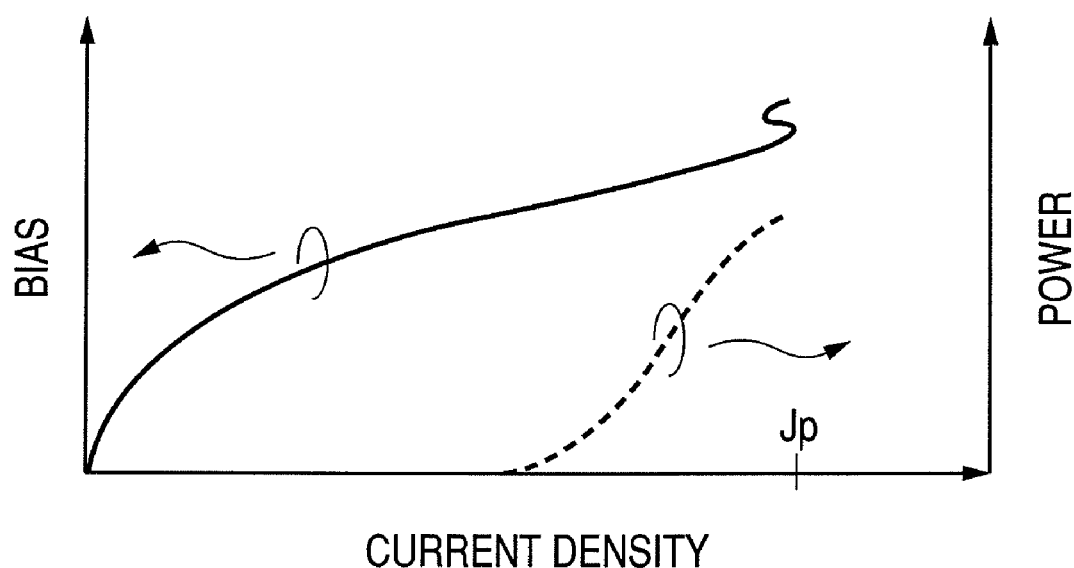
FIG. 8 is a graph for indicating that an operating point of a laser oscillation is unstable in a conventional long wavelength laser.

FIGS. 7A and 7B illustrate an embodiment of a laser device to which the present invention can be applied. In this embodiment, the gain medium is a semiconductor multi-layered film structure with several hundred to several thousand layers, which is used in a quantum cascade laser. In such a gain medium, it is conceived that a gain which is generated based on an intersubband transition widely ranges over a terahertz wave band. A tunnel injection is used as a current injection method also in the semiconductor multi-layered film structure with several hundred to several thousand layers, which is used in the quantum cascade laser, and the negative differential resistance region appears in the I-V characteristics. For example, FIG. 8 indicates a typical example thereof. The operating point where a gain is generated partially includes the negative differential resistance region. When such a negative differential resistance region is selected as an operating point, the operating point is generally unstable. Further, in addition to the I-V characteristics, FIG. 8 also indicates a current laser oscillation output characteristics (I-L characteristics), in which the I-L characteristics are seen to be deactivated in the negative differential resistance region. In this case, current I is in abscissa. Such a typical example is, for example, a phenomenon which is found when a voltage V is controlled. Therefore, the stabilization of the laser oscillation is necessary to obtain a suitable example as a gain medium constructing a laser device to which the present invention can be applied.

In FIG. 7B, a gain medium 703 is the semiconductor multi-layered film structure with several hundred to several thousand layers, which is used in the quantum cascade laser.

For example, the semiconductor multi-layered film structure has a structure in which modules using four barrier layers are repeated, such as barrier layer/well layer/barrier layer/well layer/barrier layer/well layer/barrier layer/well layer.

One repetition unit is designed to be a 4-well structure which is well known by a person having skills in the art, but a 3-well or bound-to-continuum structure may also be used. For those layers, GaAs which shows lattice-matching on a GaAs substrate may be used as the well layer, and AlGaAs which shows lattice-matching or AlGaAs which does not show lattice-matching may be used as the barrier layer. More specifically, from the emitter side to the collector side, the semiconductor multi-layered film structure is constructed by repeating the following structure 178 times: AlGaAs 4.9 nm/GaAs 7.9 nm/AlGaAs 2.5 nm/GaAs 6.6 nm/AlGaAs 4.1 nm/n-GaAs 15.6 nm/AlGaAs 3.3 nm/GaAs 9.0 nm.

Note that Opt. Expr., Vol. 13, 3331 (2005) was referred to for the structure of the gain medium. In this case, the n-GaAs layer of 15.6 nm, which is a layer called injector and well known by a person having skills in the art, is carrier-doped to have a slightly doped electron concentration of about $2 \times 10^{16}$ cm$^{-3}$. The other layers are undoped layers on which carrier-doping is not performed intentionally. When the carriers (in this case, electrons) which are tunnel-injected from the emitter pass through the above-mentioned semiconductor multi-layered film structure, a gain is generated in the frequency range of the terahertz wave band based on the intersubband transition. Further, when applying an electrical field of 13 V, the peak current density (which corresponds to Jp of FIG. 8) is about 0.8 kA/cm$^2$, and when applying an electrical field of 13 to 14 V, the negative differential resistance is found. The gain medium 703 as described above is sandwiched by negative dielectric constant media 701 and 702 which also serve as electrical contacts. As the electrical contacts 701 and 702 of the gain medium 703 include, for example, a 50 nm n-GaAs semiconductor film which shows lattice-matching to a GaAs substrate. Here, the electron concentration is set to $5 \times 10^{18}$ cm$^{-3}$. In this manner, they are ohmically contacted with electrodes 721 and 722 such as Ti/Pd/Au. An example of the structure of the GaAS substrate has been described above; however, the present invention is not limited thereto. A semiconductor multi-layered film structure such as InAs/AlAsSb or InAs/AlSb on an InAs substrate, InGaAs/InAlAs, InGaAs/AlAs, or InGaAs/AlGaAsSb on an InP substrate, or Si/SiGe on an Si substrate can be conceived. A device body 70 including those layers described above is transferred on a transfer substrate 71 illustrated in FIG. 7A to have an embedded structure where the device body 70 is embedded by a dielectric 73. As the dielectric 73, a material such as BCB with a low dielectric constant and a less loss is selected. In this case, the size of the device body 70 is set to 1,000 μm in the propagation direction of the surface plasmon and 20 μm in the lateral direction. Note that FIG. 7A illustrates end faces 704 and 705.

In the laser device structure described above, a resistor element 72 is inserted between the first cladding (negative dielectric constant medium 701) and the second cladding (negative dielectric constant medium 702), which have negative dielectric constants, via the electrodes 721 and 722. In this embodiment, as a material of the resistor element 72, a transparent conductive film of ITO is used to form a ribbon-shaped film. It is known that, when the ITO is deposited by RF sputtering under a low temperature environment, the resistivity is about 10Ω·μm (regarding the resistivity, Japan Society for the Promotion of Science, "Transparent conductive film technology", Chapter 5, published by Ohmsha, Ltd. in 1999 was referred to). The resistance value R is set as follows so that the ITO-film resistor element 72 can be almost ignored in terms of the oscillation wavelength.

$$\text{Zin} < R \quad \text{(Formula 1)}$$

Zin is a magnitude of an input impedance of a portion where the surface current becomes maximum in the surface plasmon waveguide on which the ITO-film resistor element 72 is arranged. The Zin of this portion is sufficiently smaller (Zin<<Z0) than the characteristic impedance Z0 in the surface plasmon waveguide of the device body 70. Therefore, when a resistance value larger than Z0 is selected, Formula 1 can be satisfied. On this occasion, when the characteristic impedance Z0 in the surface plasmon waveguide is analyzed in detail, Z0 is about 60Ω in the vicinity of 3 THz. Note that, as for an analysis method for the surface plasmon waveguide, the finite element method solver of the Maxwell equations is used by reflecting free-carrier concentrations of the respective layers in the device body 70 on the complex dielectric constant model given by Drude as well known. In this embodiment, as described in FIG. 7B, the ribbon-shaped ITO-film resistor element 72 having a side with a film thickness of 1.0 μm, a width of 5 μm, and a length on the dielectric 73 of 40 μm is arranged at one side thereof so as to cross the device body 70, thereby adjusting the resistance value R to about 80Ω. As described above, an impedance mismatch between the magnitude Zin of the input impedance in the portion where the surface current is maximum and the resistance value R of the ITO-film resistor element 72 is ensured. For the arrangement method, in the case of this embodiment, the end faces 704 and 705 are open ends, and therefore portions separated from the end faces 704 and 705 by an optical length of λ/4 become first portions where the surface current is maximum. Therefore, a method is selected in which the resistor elements 72 are partially arranged at a pitch of λ/2 in the propagation direction from those portions. When an optical length is represented by neL (equivalent refractive index ne, physical length L), the equivalent refractive index in the surface plasmon waveguide is obtained and the oscillation wavelength is determined, so that the pitch of the physical length is obtained. In this case, the equivalent refractive index in the surface plasmon waveguide is about 3.0 in the vicinity of 3 THz (the above-mentioned technique was used for the analysis of the surface plasmon waveguide). In this embodiment, 3 THz is selected. On this occasion, the optical length λ/2 corresponds to 16.7 μm in terms of physical length. Further, in order to stabilize the operating point of the device body 70, the following condition (Formula 2) is to be satisfied.

$$r \leq -NDR \quad \text{(Formula 2)}$$

Here, NDR (<0) is a value of a negative differential resistance of the device body 70 in the operating point, and r is a sum of resistances of the resistor elements 72 which are arranged parallel to each other on the device body 70. On this occasion, the NDR per area at the operating point of the gain medium 703 is about $-1\times10^{-2}$ $\Omega\cdot cm^2$, and the NDR per 16.7 μm in the propagation direction is about $-3,000\Omega$. When the resistance is relatively high as described above, a small number of resistor elements 72 may be arranged in parallel to each other. In this embodiment, for example, the resistor elements 72 are arranged at first portions where the surface current flowing from the end faces 704 and 705 in the surface plasmon waveguide is maximum. If the ITO-film resistor element 72 has a resistance equal to or smaller than 100Ω per one ITO-film resistor element 72 at this time, Formula 2 can be satisfied, which is achieved in this case. Accordingly, two ITO-film resistor elements 72 are arranged on the device body 70, whereby the laser oscillation of the oscillation wavelength of about 3 THz is stabilized.

The laser device structure of this embodiment can be manufactured by the following method. First, an etch-stop layer of AlGaAS, an n-GaAs layer 702, a multiple quantum well 703 of GaAs/AlGaAs, and an n-InGaAs layer 701 are epitaxially grown on a GaAS substrate by the molecular beam epitaxy (MBE) method or the like. Ti/Pd/Au is deposited on the surface thereof as the electrode 721 and etching is performed up to the substrate to have the mesa shape with a width of 20 μm and a length of 1,000 μm as described above. For the etching, photolithography and dry etching by inductively coupled plasma (ICP) are used. Next, a pressure bonding is performed between the above-mentioned Ti/Pd/Au electrode 721 and an Au thin film formed on the transfer substrate 71 on which the Au thin film is deposited. Thermal fusion bonding using a solder such as AuSn may be used. Then, wet etching is performed with ammonia water and a hydrogen peroxide solution to selectively remove only the GaAs substrate up to the etch-stop layer. Further, when the etch-stop layer is removed, the mesa-shaped epitaxial layer is transferred on the transfer substrate 71. Then, after BCB 73 is applied by spin coating, the mesa-shaped epitaxial layer is exposed. Further, on a surface of the n-GaAs layer 702 which is exposed after the GaAs substrate is removed, an electrode 722 is formed by the lift-off method. Finally, the ITO-film resistor element 72 is deposited by the lift-off method to complete the structure described above.

As a modification of the film resistor element in this embodiment, a semiconductor having relatively approximate resistivity such as poly-Si is also conceivable in addition to the transparent conductive film such as ITO. In this embodiment, such poly-Si may be used as a film of a similar shape.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-226341, filed Aug. 31, 2007, which is hereby incorporated by reference herein in its entirety.

The invention claimed is:

1. A laser device, comprising:
   a gain medium having a gain with respect to a specific electromagnetic wave;
   a resonator structure for resonating the electromagnetic wave;
   a waveguide formed by interposing the gain medium between a first cladding and a second cladding each including a negative dielectric constant medium whose real part of a dielectric constant thereof is negative with respect to the specific electromagnetic wave; and
   a resistor element for stabilizing a potential difference between the first cladding and the second cladding, the resistor being provided to a portion where a surface current in the first cladding is maximum with the second cladding being set as a reference when the electromagnetic wave propagates in the waveguide,
   wherein the resistor element includes a schottky barrier generated between a metal and a semiconductor.

2. A laser device according to claim 1, wherein the negative dielectric constant medium includes one of a metal, a carrier-doped semiconductor, and a carrier-doped semiconductor and a metal.

3. A laser device according to claim 1, wherein the gain medium is a resonant tunneling diode based on photon-assisted tunneling.

4. A laser device according to claim 1, wherein the electromagnetic wave is an electromagnetic wave having a frequency in a range of from 30 GHz to 30 THz.

* * * * *